United States Patent
Yang et al.

(10) Patent No.: US 7,969,247 B2
(45) Date of Patent: Jun. 28, 2011

(54) CHARGE PUMP LINEARIZATION TECHNIQUE FOR DELTA-SIGMA FRACTIONAL-N SYNTHESIZERS

(75) Inventors: Zhenyu Yang, Shanghai (CN); Tianwei Liu, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 59 days.

(21) Appl. No.: 12/493,761

(22) Filed: Jun. 29, 2009

(65) Prior Publication Data

US 2010/0327981 A1 Dec. 30, 2010

(51) Int. Cl.
*H03L 7/00* (2006.01)
(52) U.S. Cl. .......................... 331/16; 331/34; 331/177 R
(58) Field of Classification Search .................. 331/16, 331/34, 177 R
See application file for complete search history.

(56) References Cited

U.S. PATENT DOCUMENTS

| | | | | |
|---|---|---|---|---|
| 5,508,660 | A * | 4/1996 | Gersbach et al. | 331/17 |
| 7,005,928 | B2 * | 2/2006 | Albasini et al. | 331/16 |

OTHER PUBLICATIONS

Jae-Shin Lee et al.; "A Charge Pump with Perfect Currrent Matching Characteristics in Phase-Locked Loops"; 5 pages; date unknown.

Sudhakar Pamarti; "A Wideband 2.4-GHz Delta-Sigma Fractional-N PLL With 1-Mb/s In-Loop Modulation"; IEEE, vol. 39, No. 1, Jan. 2004; 14 pages.

Enrico Temporiti et al.; "A 700-kHz Bandwidth Fractional Synthesizer With Spurs Compensation and Lineraization Techniques . . . "; IEEE vol. 39, No. 9, Sep. 2004; 9 pages.

Bram De Muer et al.; "On the Analysis of Fractional-N Frequency Synthesizers for High-Spectral Purity"; IEEE, vol. 50, No. 11, Nov. 2003.

* cited by examiner

*Primary Examiner* — Arnold Kinkead
(74) *Attorney, Agent, or Firm* — Bever Hoffman & Harms LLP

(57) ABSTRACT

A delta-sigma fractional-N frequency synthesizer having a charge pump with error canceling circuitry eliminates a non-linear term from the charge pump transfer function. The charge pump includes a matched pair of charging current sources, each supplying a first current $I_{P1}$ to a common node, when enabled. The charge pump also includes a matched pair of discharging current sources, each sinking a second current $I_{N1}$ from the common node, when enabled. The error canceling circuitry includes a charging current source, which supplies a current equal to the second current $I_{N1}$ to the common node, when enabled. The error canceling circuitry also includes a discharging current source, which sinks a current equal to the first current $I_{P1}$ from the common node, when enabled. The charging and discharging current sources of the error canceling circuitry are both enabled when either one of the matched pairs of charging and discharging current sources is enabled.

14 Claims, 6 Drawing Sheets

CHARGE PUMP LINEARIZATION TECHNIQUE FOR DELTA-SIGMA FRACTIONAL-N SYNTHESIZERS

FIELD OF THE INVENTION

The present invention relates a structure and method for improving the linearity of a Delta-Sigma fractional-N synthesizer.

RELATED ART

FIG. 1 is a block diagram of a conventional delta-sigma fractional-N frequency synthesizer 100, which includes reference frequency generator 101, phase frequency detector (PFD) 102, charge pump 103, low pass filter 104, voltage controlled oscillator (VCO) 105, multi-modulus divider 106 and digital sigma-delta modulator 107. Reference frequency generator 101 provides a reference signal $F_{REF}$ having a fixed reference frequency to one input of phase frequency detector 102. The other input of phase frequency detector 102 is coupled to receive a divided frequency signal $F_{DIV}$ from multi-modulus divider 106. Multi-modulus divider 106 creates the divided frequency signal $F_{DIV}$ by dividing an output signal $F_{OUT}$ provided by VCO 105. Phase frequency detector 102 monitors the phase differences between the reference signal $F_{REF}$ and the divided signal $F_{DIV}$, and in response, generates the charge pump control signals UP and DN. In general, the charge pump 103 adjusts a control voltage $V_{CTRL}$ in response to the charge pump control signals UP and DN. The control voltage $V_{CTRL}$ is provided to low pass filter 104, which includes resistors R1-R2 and capacitors C1-C3. Low pass filter 104 passes a low frequency component of the control voltage $V_{CTRL}$ to the input of VCO 105 as the input control voltage $VCO_{IN}$. VCO 105 adjusts the frequency of the output signal $F_{OUT}$ in response to the input control voltage $VCO_{IN}$.

The frequency of the output signal $F_{OUT}$ is determined by the frequency of the reference signal $F_{REF}$ and the divisor(s) implemented by the multi-modulus divider 106. For example, for a divisor of N (wherein N is an integer), the frequency of the output signal $F_{OUT}$ will be N times the frequency of the reference signal $F_{REF}$. In order to provide an output signal $F_{OUT}$ having a frequency that is not an integer multiple of the reference frequency, the divisor implemented by multi-modulus divider 106 may be adjusted to have different values over time. For example, the divisor may be dithered between values of N and N+1 over a plurality of cycles, such that the output signal $F_{OUT}$ has an average frequency between N and N+1 times the frequency of the reference signal $F_{REF}$. Modulator 107 controls the divisor of multi-modulus divider 106 in response to a received signal sequence K, thereby controlling the frequency of the output signal $F_{OUT}$. Modulator 107 is typically designed to change the divisor in a manner that minimizes noise in the output signal $F_{OUT}$.

In general, the delta-sigma fractional-N frequency synthesizer 100 may be viewed as a delta-sigma digital-to-frequency converter. Noise leakage due to non-linearity in the conversion is bound to degrade the in-band phase noise and spur performance, as in the case of delta-sigma digital-to-analog converters (DACs). (See, e.g., Bram De Muer and Steyaert, M. S. J., "On the analysis of Δ-Σ fractional synthesizers for high-spectral purity", IEEE Transactions on Circuits and Systems II: Analog and Digital Signal Processing, November 2003, Vol. 50, Issue 11, pp. 784-793.) As a result, the linearity requirement of the charge pump 103 is critical.

FIG. 2A is a conceptual circuit diagram of a current-supplying portion of a conventional charge pump 103, which includes switches 201-202 and current sources 211-212. Current sources 211 and 212 provide currents $I_P$ and $I_N$, respectively. Switch 201, which is controlled by the UP signal, couples the current source 211 to the $V_{DD}$ supply terminal. Switch 202, which is controlled by the DN signal, couples the current source 212 to the ground supply terminal ($V_{SS}$). Charge pump 103 provides a charge pump current $I_{CP}$ at node 210. The control voltage $V_{CTRL}$ is derived from the charge pump current $I_{CP}$ in a manner known to those of ordinary skill in the art.

FIG. 2B is a timing diagram 220 that illustrates the operation of charge pump 103. Ideally, the currents $I_P$ and $I_N$ and are equal, but in practice, these current sources $I_P$ and $I_N$ can differ significantly because the current sources 211 and 212 have finite output impedances, and the voltages these current sources drop are different from each other as a function of the VCO control voltage $V_{CTRL}$. The currents $I_P$ and $I_N$ may be represented by the following equations:

$$I_P = I_{CM} - \Delta I/2 \qquad (1)$$

$$I_N = I_{CM} + \Delta I/2 \qquad (2)$$

wherein $I_{CM}$ is the desired common-mode current value, and $\Delta I$ is the desired differential-mode current value.

In the example illustrated by FIG. 2B, the $n^{th}$ rising edge of the reference signal $F_{REF}$ occurs at time $T_0$, and the $n^{th}$ rising edge of the divided frequency signal $F_{DIV}$ occurs shortly thereafter at time $T_1$. Phase frequency detector 102 activates the UP signal (low) at time $T_0$, thereby turning on switch 201. At this time, the current $I_P$ (i.e., $I_{CM}-\Delta I/2$) is provided as the charge pump current $I_{CP}$. Phase frequency detector 102 then activates the DN signal (high) at time $T_1$, thereby turning on switch 202. At this time, a current of $I_P-I_N$ (i.e., $-\Delta I$) is provided as the charge pump current $I_{CP}$. Phase frequency detector 102 then deactivates the UP and DN signals at time $T_2$, thereby turning off switches 201 and 202. Note that the UP and DN signals are deactivated a predetermined time after the last rising edge of the UP and DN signals.

The net charge ($Q_{CP}[n]$) transferred to the low pass filter 104 by the instantaneous current ($I_{CP}(t)=I_P(t)-I_N(t)$) during the $n^{th}$ reference period may be represented by the following equation:

$$Q_{CP}[n] = (I_{CM}*Ti) - (\Delta I*Ton) \pm (\Delta I/2*Ti) \qquad (3)$$

wherein Ti is the time difference between the $n^{th}$ rising edges of the reference signal $F_{REF}$ and the divided signal $F_{DIV}$ (i.e., $T_1-T_0$), and Ton is the time that both of the switches 201 and 202 are activated (i.e., $T_2-T_1$). The first term of equation (3) (i.e., $I_{CM}*Ti$) is the desired component of the charge pump current $I_{CP}$. The second term of equation (3) (i.e., $\Delta I*Ton$) has no effect on the phase noise of synthesizer 100, other than introducing a constant offset. However, the third term of equation (3) (i.e., $\Delta I/2*Ti$) is nonlinear with respect to time Ti. That is, the net charge transferred to low pass filter 104 during the $n^{th}$ reference period has a non-linear term which is related to the instantaneous comparing phase.

Several techniques have been used to improve the linearity of charge pump 103. However these techniques typically worsen the reference spur and/or the in-band noise performance (because of the relatively long "Ton" periods associated with these techniques). One example of such a technique is described by E. Temporiti et al., "A 700 kHz bandwidth Δ-Σ fractional synthesizer with spurs compensation and linearization techniques for WCDMA applications", IEEE J. Solid-State Circuits, September 2004, Vol. 39, Issue 9, pp. 1446-

1454. Temporiti et al. construct a DC offset circuit and an offset cancellation circuit to cancel the non-linear term and improve the reference spur performance. However, the injection of periodic current pulses into the loop filter worsens the in-band phase noise of the resulting synthesizer.

Another example is described by S. Pamarti et al., "A wideband 2.4 GHz Δ-Σ fractional-N PLL with 1 Mb/s in-loop modulation", IEEE J. Solid-State Circuits, January 2004, Vol. 39, Issue 1, pp. 49-62. Pamarti et al. construct a compensation circuit to cancel the non-linear term. This compensation circuit divides the original charge pump 103 into dual identical branches. In addition, the phase frequency divider 102 is modified to generate a compensation clock, which results in a much longer "Ton" period than in a conventional synthesizer. As a result, the reference spur (which is critical in wide bandwidth synthesizers) and the in-band noise performance are worsened.

It would therefore be desirable to have an improved charge pump circuit for use in a delta-sigma fractional-N frequency synthesizer, wherein the charge pump circuit eliminates the non-linear term of a conventional charge pump 103, and does not adversely effect the reference spur or in-band noise performance of the synthesizer.

SUMMARY

Accordingly, the present invention provides a charge pump linearization technique which adopts an error canceling circuit to cancel the non-linear term that exists within conventional delta-sigma fractional-N frequency synthesizers. Using this technique, a delta-sigma fractional-N frequency synthesizer operates with reduced in-band noise and improved reference and fractional spur performance.

In accordance with one embodiment of the present invention, the charge pump of a delta-sigma fractional-N frequency synthesizer includes a matched pair of charging current sources, each coupled between a $V_{DD}$ supply terminal and a common node. When enabled (e.g., by the UP control signal of an associated phase frequency detector), each of the matched pair of charging current sources supplies a first current $I_{P1}$ from the $V_{DD}$ supply terminal to the common node.

The charge pump also includes a matched pair of discharging current sources, each coupled between the common node and a $V_{SS}$ supply terminal. When enabled (e.g., by the DN control signal of an associated phase frequency detector), each of the matched pair of discharging current sources sinks a second current $I_{N1}$ from the common node to the $V_{SS}$ supply terminal.

The error canceling circuit includes a charging current source coupled between the $V_{DD}$ supply terminal and the common node, and a discharging current source coupled between the common node and the $V_{SS}$ supply terminal. When enabled, the charging current source of the error canceling circuit supplies a current equal to the second current $I_{N1}$ from the $V_{DD}$ supply terminal to the common node. When enabled, the discharging current source of the error canceling circuit sinks a current equal to the first current $I_{P1}$ from the common node to the $V_{SS}$ supply terminal. The charging and discharging current sources of the error canceling circuit are enabled whenever the matched pair of current sources or the matched pair of discharging current sources are enabled. The error canceling circuit advantageously eliminates the non-linear term (i.e., ΔI/2*Ti) that exists in the transfer function of the conventional charge pump 103 of FIG. 1.

The present invention will be more fully understood in view of the following description and drawings.

DETAILED DESCRIPTION

Figure 1:
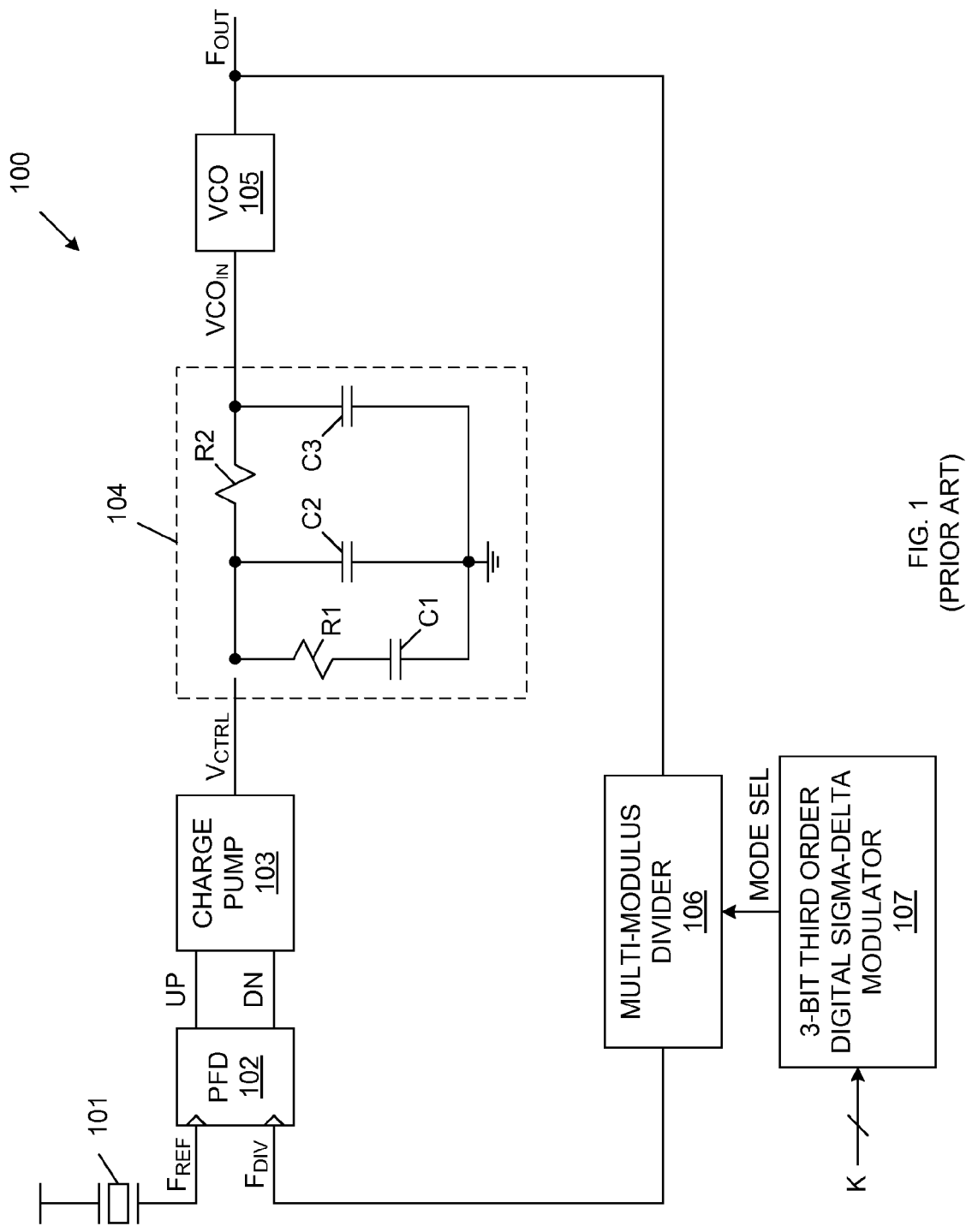
FIG. 1 is a block diagram of a conventional delta-sigma fractional-N frequency synthesizer.
Figure 3:
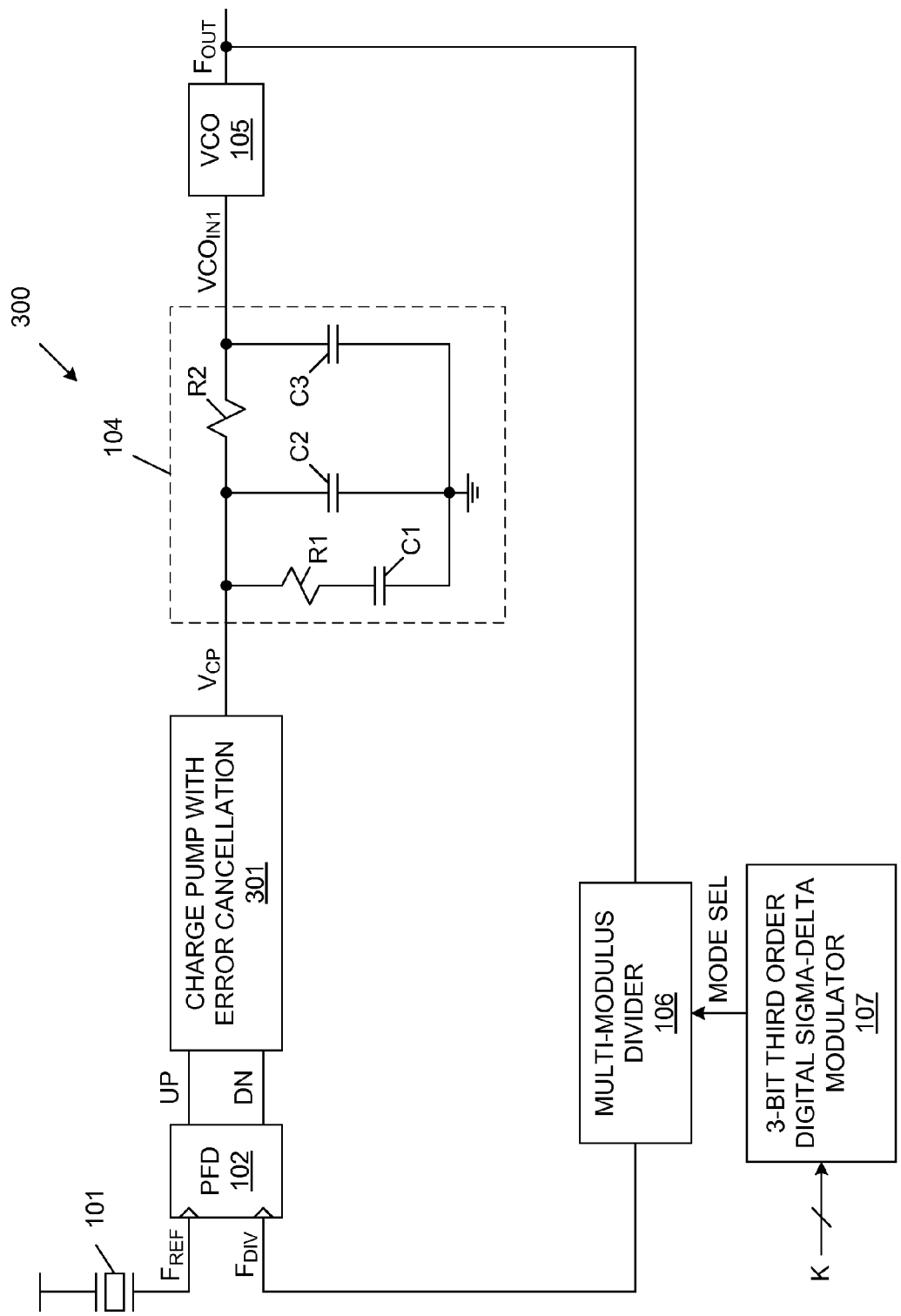
FIG. 3 is a block diagram of a delta-sigma fractional-N frequency synthesizer in accordance with one embodiment of the present invention.

FIG. 3 is a block diagram of a delta-sigma fractional-N frequency synthesizer 300 in accordance with one embodiment of the present invention. Because synthesizer 300 includes similar elements as synthesizer 100, similar elements are labeled with similar reference number in FIGS. 1 and 3. Thus, delta-sigma fractional-N frequency synthesizer 300 includes reference frequency generator 101, phase frequency detector 102, low pass filter 104, voltage controlled oscillator (VCO) 105, multi-modulus divider 106 and digital sigma-delta modulator 107, which have been generally described above in connection with FIG. 1. However, delta-sigma fractional-N frequency synthesizer 300 replaces the conventional charge pump 103 of synthesizer 100 with an improved charge pump 301, which includes error cancellation circuitry for eliminating the non-linear term introduced by the conventional charge pump 103. Charge pump 301 provides an output voltage $V_{CP}$ in response to the UP/DN signals provided by phase frequency detector 102. As described in more detail below, charge pump 301 eliminates the non-linear term introduced by the charge pump 103 in a manner that does not increase the in-band noise or adversely affect the reference spur.

Figure 4:
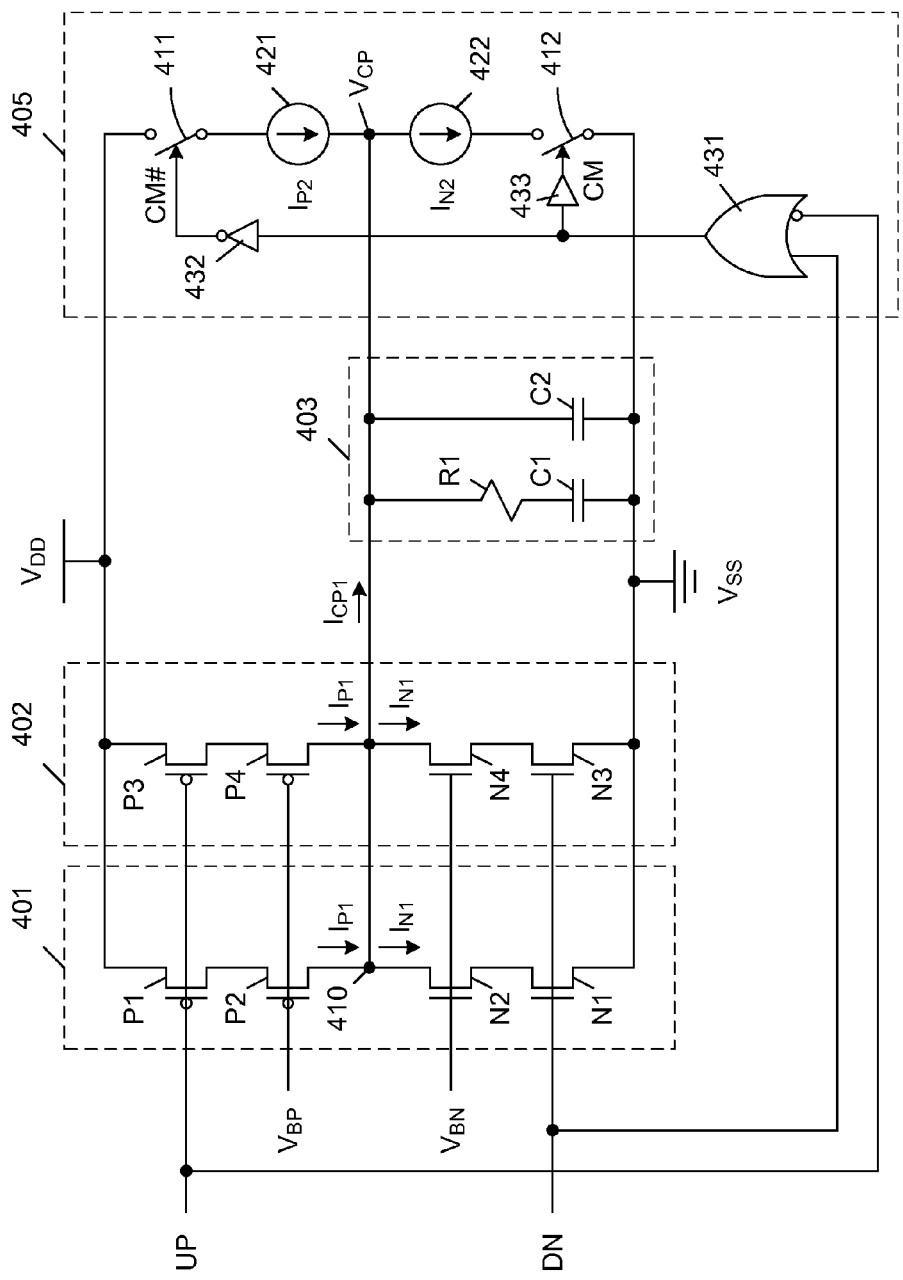
FIG. 4 is a circuit diagram of charge pump that implements error cancellation in accordance with one embodiment of the present invention.

FIG. 4 is a circuit diagram of a current-supplying portion of a charge pump 301 in accordance with one embodiment of the present invention. Charge pump 301 includes a pair of charge pump circuit branches 401-402 and an error canceling circuit 405. Note that a portion 403 of low pass filter 104, which includes resistor R1 and capacitors C1-C2, is also illustrated in FIG. 4. The low pass filter portion 403 includes resistor R1 and capacitors C1-C2, which form a conventional two order filter, wherein resistor R1 and capacitor C1 are used to construct a zero, and capacitor C2 is used to filter out high frequency voltage ripple. The transfer function of low pass filter portion 403 may be described by the following mathematical expression: $V_{cp}/I_{cp}=(1/C_2)*(s+1/R_1C_1)/(s*(s+(C_1+C_2)/R_1C_1C_2))$.

Charge pump circuit branch 401 includes PMOS transistors P1-P2 and NMOS transistors N1-N2. PMOS transistors P1-P2 are connected in series between the $V_{DD}$ voltage supply terminal and common node 410. NMOS transistors N1 and N2 are connected in series between the $V_{SS}$ (ground)

supply terminal and common node 410. Charge pump circuit branch 402 includes PMOS transistors P3-P4 and N3-N4. PMOS transistors P3-P4 are connected in series between the $V_{DD}$ supply terminal and common node 410, in parallel with PMOS transistors P1-P2. NMOS transistors N3-N4 are connected in series between the $V_{SS}$ supply terminal and common node 410, in parallel with NMOS transistors N1-N2.

PMOS transistors P1 and P3 are biased by the UP signal provided by phase frequency detector 102. When the UP signal is activated (low), PMOS transistors P1 and P3 switch on to allow current flow through PMOS transistors P2 and P4, respectively. PMOS transistors P2 and P4 are biased by a PMOS bias voltage $V_{BP}$. The PMOS bias voltage $V_{BP}$ is controlled such that a desired current $I_{P1}$ (described below) flows through each of the transistors P2 and P4 when the UP signal is activated (low). Thus, PMOS transistors P2 and P4 may be considered to be current sources.

NMOS transistors N1 and N3 are biased by the DN signal provided by phase frequency detector 102. When the DN signal is activated (high), NMOS transistors N1 and N3 switch on to allow current flow through NMOS transistors N2 and N4, respectively. NMOS transistors N2 and N4 are biased by an NMOS bias voltage $V_{BN}$. The NMOS bias voltage $V_{BN}$ is controlled such that a desired current $I_{N1}$ (described below) flows through each of the transistors N2 and N4 when the DN signal is activated (high). Thus, NMOS transistors N2 and N4 may be considered to be current sources.

Transistors P1 and P3 are identical, and transistors P2 and P4 are identical, such that identical currents ($I_{P1}$) flow through transistors P1-P2 and transistors P2-P4. Similarly, transistors N1 and N3 are identical, and transistors N2 and N4 are identical, such that identical currents ($I_{N1}$) flow through transistors N1-N2 and N3-N4.

Charge pump circuit branches 401 and 402 may be viewed as two nominally identical, half-sized current sources, when compared with conventional charge pump circuit 103. Thus, the currents $I_{P1}$ and $I_{N1}$ may be represented by the following equations:

$$I_{P1}=(I_{CM}-\Delta I/2)/2 \tag{4}$$

$$I_{N1}=(I_{CM}+\Delta I/2)/2 \tag{5}$$

wherein $I_{CM}$ is the desired common-mode current value, and $\Delta I$ is the desired differential-mode current value.

Error cancellation circuit 405 includes switches 411-412, current sources 421-422, logical OR gate 431, inverter 432 and buffer 433. Switch 411 and current source 421 are connected in series between the $V_{DD}$ supply terminal and common node 410. Switch 412 and current source 422 are connected in series between the $V_{SS}$ supply terminal and common node 410. Logical OR gate 431 includes a non-inverting input terminal coupled to receive the DN signal, and an inverting input terminal coupled to receive the UP signal. Logical OR gate 431 provides a common mode control signal CM in response to the UP and DN signals. Switches 411 and 412 are controlled by the common mode control signal CM. More specifically, buffer 433 passes the common mode signal CM to switch 412. In one embodiment, switch 412 is implemented by an NMOS transistor, such that switch 412 is activated (conductive) when the common mode signal CM is activated (high). Switch 411 receives the inverse of the common mode signal CM (i.e., CM#) from inverter 432. In one embodiment, switch 411 is a PMOS transistor, such that switch 411 is activated (conductive), when common mode signal CM is activated high (i.e., CM# is low). Thus, switches 411-412 are both switched on (conductive) when either the UP signal or the DN signal is activated. Inverter 432 and buffer 433 are selected to introduce the same timing delays to the received common mode signal CM.

Current sources 421 and 422 provide currents $I_{P2}$ and $I_{N2}$, respectively. Error cancellation circuit 405 is designed such that the currents $I_{P2}$ and $I_{N2}$ may be represented by the following equations.

$$I_{P2}=I_{N1} \tag{6}$$

$$I_{N2}=I_{P1} \tag{7}$$

Thus, the current $I_{P1}$ that flows through PMOS transistors P1-P2 (and P3-P4) from the $V_{DD}$ supply terminal to the common node 410 is replicated by current source 422, such that this same current ($I_{P1}=I_{N2}$) flows from common node 410 to the $V_{SS}$ supply terminal. Similarly, the current $I_{N1}$ that flows through NMOS transistors N1-N2 (and N3-N4) from the common node 410 to the $V_{SS}$ supply terminal is replicated by current source 421, such that this same current ($I_{N1}=I_{P2}$) flows from the $V_{DD}$ supply terminal to the common node 410.

Figure 5:
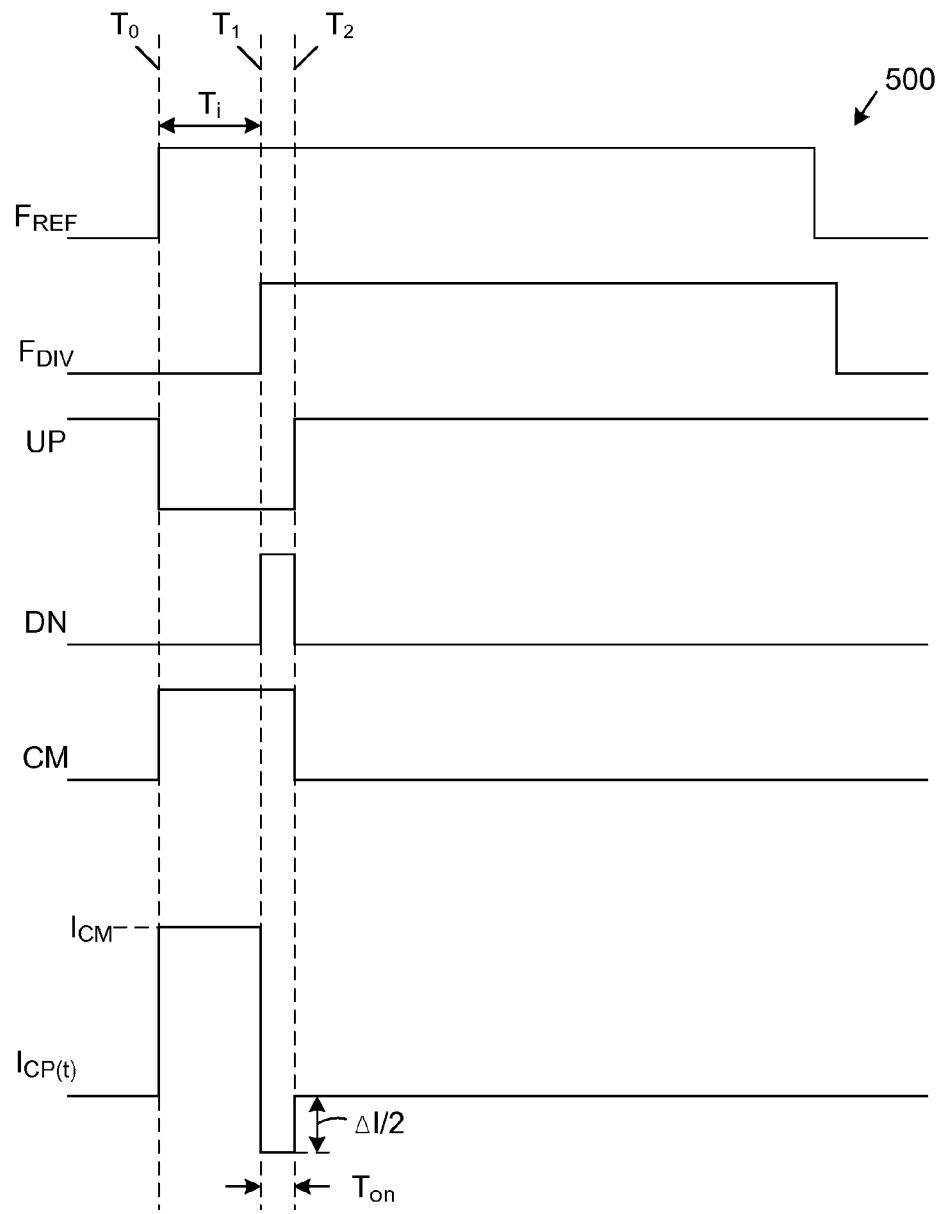
FIG. 5 is a timing diagram that illustrates the operation of the charge pump of FIG. 4 in accordance with one embodiment of the present invention.

FIG. 5 is a timing diagram 500 that illustrates the operation of charge pump 301 in accordance with one embodiment of the present invention. In the example illustrated by FIG. 5, the $n^{th}$ rising edge of the reference signal $F_{REF}$ occurs at time $T_0$, and the $n^{th}$ rising edge of the divided signal $F_{DIV}$ occurs shortly thereafter at time $T_1$. Phase frequency detector 102 activates the UP signal (low) at time $T_0$ (in response to the rising edge of $F_{REF}$) thereby turning on transistors P1 and P3. The low state of the UP signal also causes OR gate 431 to activate the common mode control signal CM to a logic high state (and also activate the common mode control signal CM# to a logic low state). As a result, switches 411 and 412 are both activated (become conductive). At this time, the charge pump current $I_{CP1}$ can be represented by the following equations.

$$I_{CP1}=I_{P1}+I_{P1}+I_{P2}-I_{N2} \tag{8}$$

$$I_{CP1}=I_{CM} \tag{9}$$

Phase frequency detector 102 then activates the DN signal (high) at time $T_1$ (in response to the rising edge of $F_{DIV}$), thereby turning on transistors N1 and N3. Note that the high state of the DN signal does not change the common mode control signal CM provided at the output of logical OR gate 431. At this time, the charge pump current $I_{CP1}$ can be represented by the following equations.

$$I_{CP1}=I_{P1}+I_{P1}+I_{P2}-I_{N1}-I_{N1}-I_{N2} \tag{10}$$

$$I_{CP1}=(I_{CM}-\Delta I/2)/2-(I_{CM}+\Delta I/2)/2 \tag{11}$$

$$I_{CP1}=-\Delta I/2 \tag{12}$$

Phase frequency detector 102 subsequently deactivates the UP signal (high) and the DN signal (low) at time $T_2$, thereby turning off transistors P1, P3, N1 and N3. The deactivated UP and DN signals cause logical OR gate 431 to de-activate the common mode control signal CM to a logic low state, such that switches 411 and 412 are also deactivated (non-conductive). At this time the charge pump current $I_{CP1}$ becomes zero.

The net charge ($Q_{CP1}[n]$) transferred to the low pass filter 104 by the charge pump current $I_{CP1}$ during the $n^{th}$ reference period may be represented by the following equations:

$$Q_{CP1}[n]=(Ti*I_{CM})-(Ton*\Delta I/2) \tag{13}$$

wherein Ti is the time difference between the $n^{th}$ rising edges of the reference signal $F_{REF}$ and the divided signal $F_{DIV}$ (i.e., $T_1-T_0$), and Ton is the time period during which the UP and DN signals are both activated (i.e., $T_2-T_1$). The first term of equation (13) (i.e., $Ti*I_{CM}$) is the desired component of the charge pump current $I_{CP}$. The second term of equation (13)

Figure 2:
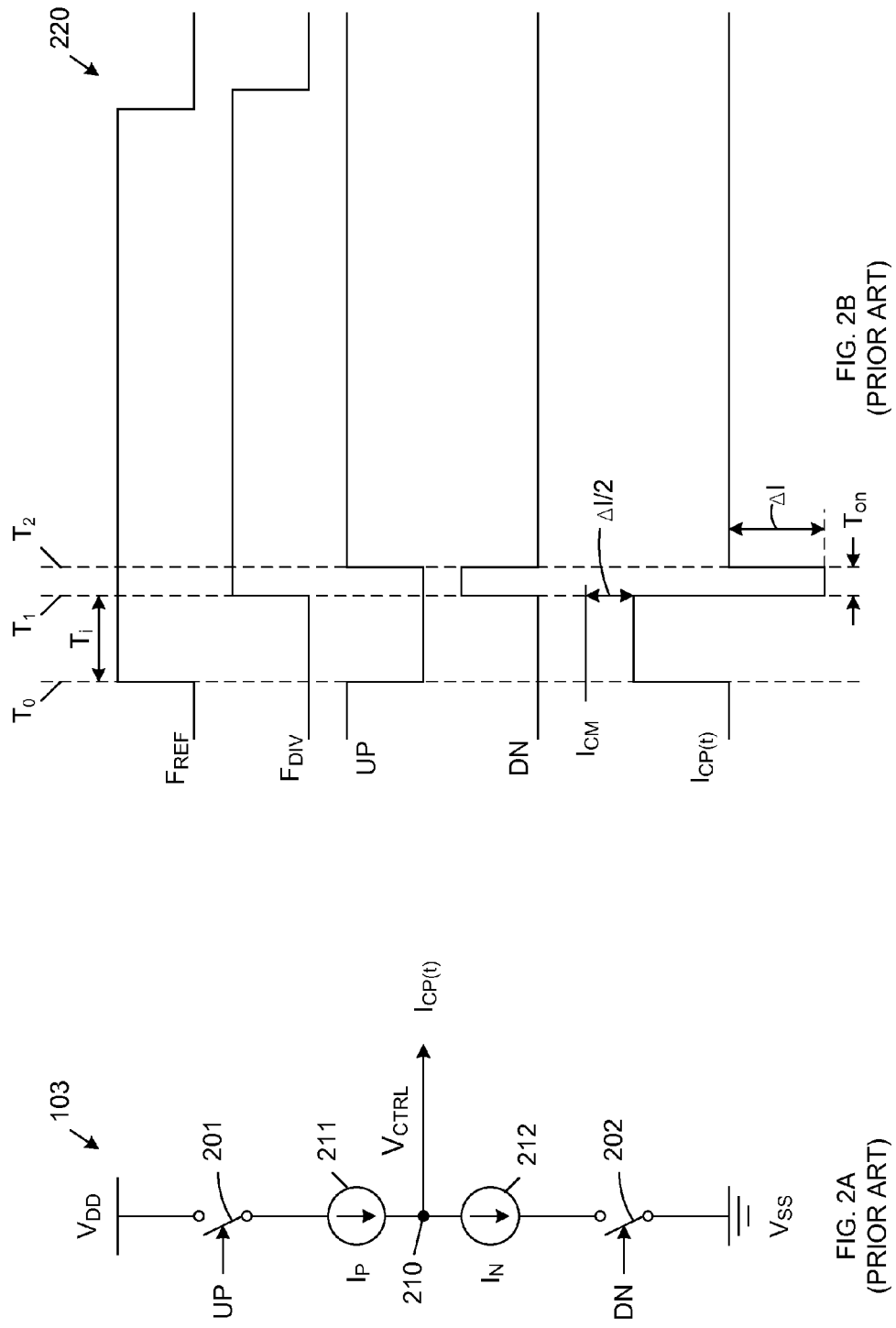
FIG. 2A is a circuit diagram of conventional charge pump, which is used in the synthesizer of FIG. 1.
FIG. 2B is a timing diagram that illustrates the operation of the charge pump of FIG. 2A.

(i.e., Ton*ΔI/2) has no effect on the phase noise of synthesizer 300, other than introducing a constant offset. Note that unlike equation (3), equation (13) does not include any term that is non-linear with respect to the time Ti. The error cancellation circuit 405 of charge pump circuit 301 effectively cancels the non-linear term of equation (3). A comparison of the charge pump current waveforms of FIGS. 2A and 5 indicates that the charge pump current $I_{CP1}$ of charge pump circuit 301 is greater than the charge pump current $I_{CP}$ of charge pump circuit 103 by a value of ΔI/2 between times $T_0$ and $T_2$.

Using the above-described error cancellation technique, charge pump circuit 301 operates in a highly linear manner, such that the delta-sigma fractional-N frequency synthesizer 300 operates with reduced in-band noise. More specifically, the improved linearity of charge pump circuit 301 results in reduced fold-back noise, which in turn, reduces the in-band phase noise. For example, the in-band noise may be as low as that present when a conventional synthesizer having the same loop parameters is operated in an integer mode (i.e., the divisor has a fixed integer value, which is the same as the fractional mode). In addition, the highly linear operation of charge pump circuit 301 results in improved reference and fractional spur performance.

Figure 6:
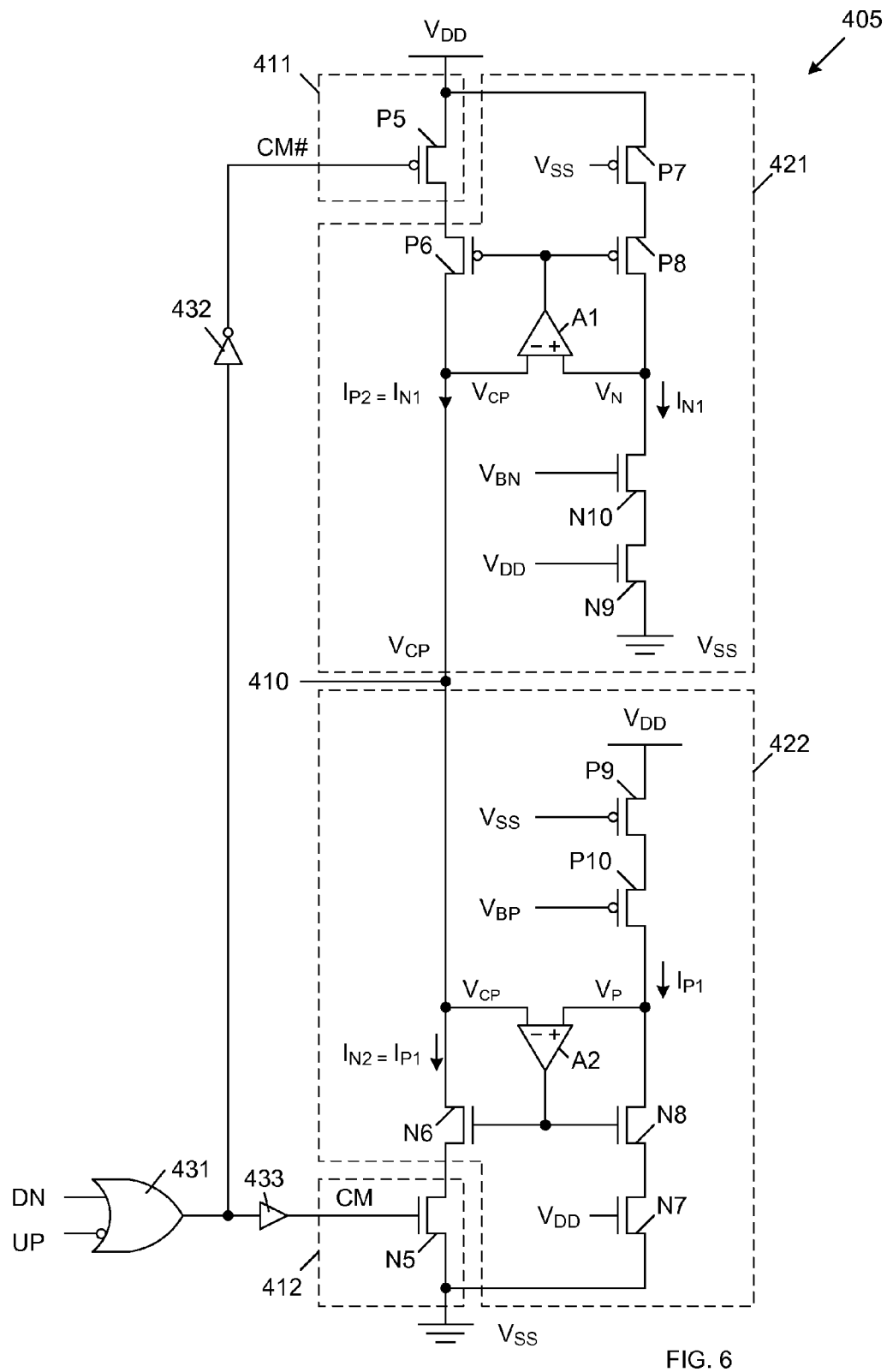
FIG. 6 is a circuit diagram of an error cancellation circuit implemented within the charge pump of FIG. 4 in accordance with one embodiment of the present invention.

FIG. 6 is a circuit diagram of error cancellation circuit 405 in accordance with one embodiment of the present invention. In the illustrated embodiment, switch 411 is implemented by PMOS transistor P5, and switch 412 is implemented by NMOS transistor N5. Current source 421 is implemented by amplifier A1, PMOS transistors P6-P8 and NMOS transistors N9-N10. Current source 422 is implemented by amplifier A2, NMOS transistors N6-N8 and PMOS transistors P9-P10.

Within current source 421, PMOS transistors P7 and P8 are connected in series between the $V_{DD}$ supply terminal and the positive input terminal of amplifier A1. PMOS transistors P7 and P8 are designed to be identical to PMOS transistors P1 and P2, respectively (and PMOS transistors P3 and P4, respectively). NMOS transistors N9 and N10 are connected in series between the positive input terminal of amplifier A1 and the $V_{SS}$ supply terminal. NMOS transistors N9 and N10 are designed to be identical to NMOS transistors N1 and N2, respectively (and NMOS transistors N3 and N4, respectively).

PMOS transistor P7 is biased by the $V_{SS}$ supply voltage (i.e., the same voltage applied to PMOS transistors P1 and P3 when the UP signal is activated). NMOS transistor N10 is biased by the same bias voltage $V_{BN}$ applied to NMOS transistors N2 and N4. NMOS transistor N9 is biased by the $V_{DD}$ supply voltage (i.e., the same voltage applied to NMOS transistors N1 and N3 when the DN signal is activated).

PMOS transistor P6 is coupled between PMOS transistor P5 and the negative input terminal of amplifier A1. PMOS transistor P6 is designed to be identical to PMOS transistor P8. PMOS transistor P5 is also designed to be identical to PMOS transistor P7. Note that PMOS transistor P5 is biased by the $V_{SS}$ supply voltage when the common mode signal CM is activated. PMOS transistors P6 and P8 are both biased by the output of amplifier A1. Ignoring the input mismatch voltage of amplifier A1, and optimizing transistor dimensions to reduce any random offset, amplifier A1 ensures that the voltage $V_N$ on the positive input terminal of amplifier A1 is equal to the voltage $V_{CP}$ on common node 410 (i.e., the voltage on the negative input terminal of amplifier A1), while the common mode signal CM is activated.

When charge pump circuit 301 is providing discharging currents $I_{N1}$ (i.e., when the DN signal is activated), the discharging currents $I_{N1}$ flowing through NMOS transistors N2 and N4 will be equal to the current $I_{P2}$ flowing through NMOS transistor N10, because these transistors N2, N4 and N10 are matched. Note that the current $I_{N1}$ flowing through NMOS transistor N10 also flows through PMOS transistor P8. Because PMOS transistors P8 and P6 are also matched, the current $I_{N1}$ flowing through PMOS transistor P8 will be equal to the current flowing through PMOS transistor P6. In this manner, current source 421 provides a current $I_{P2}$ to common node 410 while the common mode control signal CM is activated, wherein this current $I_{P2}$ is equal to the current $I_{N1}$ that flows through NMOS transistors N2 and N4 when the DN signal is activated.

Current source 422 operates in the same basic manner as current source 421. Within current source 422, NMOS transistors N7 and N8 are connected in series between the $V_{SS}$ supply terminal and the positive input terminal of amplifier A2. NMOS transistors N7 and N8 are designed to be identical to NMOS transistors N1 and N2, respectively (and NMOS transistors N3 and N4, respectively). PMOS transistors P9 and P10 are connected in series between the positive input terminal of amplifier A1 and the $V_{DD}$ supply terminal. PMOS transistors P9 and P10 are designed to be identical to PMOS transistors P1 and P2, respectively (and PMOS transistors P3 and P4, respectively).

NMOS transistor N7 is biased by the $V_{DD}$ supply voltage (i.e., the same voltage applied to NMOS transistors N1 and N3 when the DN signal is activated). PMOS transistor P10 is biased by the same bias voltage $V_{BP}$ applied to PMOS transistors P2 and P4. PMOS transistor P9 is biased by the $V_{SS}$ supply voltage (i.e., the same voltage applied to PMOS transistors P1 and P3 when the UP signal is activated).

NMOS transistor N6 is coupled between NMOS transistor N5 and the negative input terminal of amplifier A2. NMOS transistor N6 is designed to be identical to NMOS transistor N8. NMOS transistor N5 is also designed to be identical to NMOS transistor N7. Note that NMOS transistor N5 is biased by the $V_{DD}$ supply voltage when the common mode signal CM is activated. NMOS transistors N6 and N8 are both biased by the output of amplifier A2. Ignoring the input mismatch voltage of amplifier A2, and optimizing transistor dimensions to reduce any random offset, amplifier A2 ensures that the voltage $V_P$ on the positive input terminal of amplifier A2 is equal to the voltage $V_{CP}$ on common node 410 (i.e., the voltage on the negative input terminal of amplifier A2), while the common mode signal CM is activated. When charge pump circuit 301 is providing charging currents $I_{P1}$ (i.e., when the UP signal is activated), the charging currents $I_{P1}$ flowing through PMOS transistors P2 and P4 will be equal to the current $I_{P1}$ flowing through PMOS transistor P10, because these transistors P2, P4 and P10 are matched. Note that the current $I_{P1}$ flowing through PMOS transistor P10 also flows through NMOS transistor N8. Because NMOS transistors N8 and N6 are also matched, the current $I_{P1}$ flowing through NMOS transistor N8 will be equal to the current flowing through NMOS transistor N6. In this manner, current source 422 draws a current $I_{N2}$ from common node 410 while the common mode control signal CM is activated, wherein this current $I_{N2}$ is equal to the current $I_{P1}$ that flows through PMOS transistors P2 and P4 when the UP signal is activated.

Although the invention has been described in connection with several embodiments, it is understood that this invention is not limited to the embodiments disclosed, but is capable of various modifications, which would be apparent to one of ordinary skill in the art. Thus, the present invention is only intended to be limited by the following claims.

We claim:

1. A charge pump circuit comprising:
   a first charge pump branch having a first charging current source that supplies a first charging current from a first supply terminal to a common node, and a first discharging current source that supplies a first discharging current from the common node to a second supply terminal;
   a second charge pump branch having a second charging current source that supplies a second charging current from the first supply terminal to the common node, and a second discharging current source that supplies a second discharging current from the common node to the second supply terminal; and
   an error cancellation circuit having a third charging current source that supplies a third charging current from the first supply terminal to the common node, and a third discharging current source that supplies a third discharging current from the common node to the second supply terminal, wherein the first charging current, the second charging current and the third discharging current are equal, and the first discharging current, the second discharging current and the third charging current are equal.

2. The charge pump circuit of claim 1, further comprising:
   a first set of switches that enable the first charging current source and the second charging current source when a first charge pump control signal is activated;
   a second set of switches that enable the first discharging current source and the second discharging current source when a second charge pump control signal is activated; and
   a third set of switches that enable the third charging current source and the third discharging current source when at least one of the first and second charge pump control signals is activated.

3. The charge pump circuit of claim 1, wherein an output voltage of the charge pump circuit is provided on the common node.

4. The charge pump circuit of claim 1, wherein the first charging current, the second charging current and the third discharging current are equal to $(I_{CM}-\Delta I/2)/2$, and the first discharging current, the second discharging current, and the third charging current are equal to $(I_{CM}+\Delta I/2)/2$, wherein $I_{CM}$ is a common-mode current provided at the common node, and $\Delta I$ is a differential-mode current provided at the common node.

5. A delta-sigma fractional-N frequency synthesizer comprising:
   a voltage controlled oscillator (VCO) that provides an output signal having an output frequency in response to a VCO control voltage;
   a multi-modulus divider that divides the output signal to create a divided frequency signal;
   a phase detector that receives the divided frequency signal and a reference frequency signal, and in response, generates a first charge pump control signal and a second charge pump control signal that are representative of a phase difference between the divided frequency signal and the reference frequency signal; and
   a charge pump that generates the VCO control voltage on a common node in response to the first and second charge pump control signals, wherein the charge pump includes a pair of matched charging current sources that are enabled to supply current to the common node when the first charge pump control signal is activated, a pair of matched discharging current sources that are enabled to sink current from the common node when the second charge pump control signal is activated, and an error cancellation circuit that includes a charging current source that is enabled to supply current to the common node and a discharging current source that is enabled to sink current from the common node when one or more of the first and second charge pump control signals is activated.

6. The delta-sigma fractional-N frequency synthesizer of claim 5, wherein a current flowing through each of the pair of matched charging current sources is equal to a current flowing through the discharging current source of the error cancellation circuit when the first charge pump control signal is activated.

7. The delta-sigma fractional-N frequency synthesizer of claim 6, wherein a current flowing through each of the pair of matched discharging charging current sources is equal to a current flowing through the charging current source of the error cancellation circuit when the second charge pump control signal is activated.

8. A method of operating a charge pump circuit comprising:
   supplying a first charging current from a first supply terminal to a common node;
   supplying a second charging current from the first supply terminal to the common node;
   supplying a first discharging current from the common node to a second supply terminal;
   supplying a second discharging current from the common node to the second supply terminal;
   supplying a third charging current from the first supply terminal to the common node, wherein the first discharging current, the second discharging current and the third charging current are equal;
   supplying a third discharging current from the common node to the second supply terminal, wherein the first charging current, the second charging current and the third discharging current are equal.

9. The method of claim 8, further comprising:
   supplying the first charging current and the second charging current in response to a first charge pump control signal being activated;
   supplying the first discharging current and the second discharging current in response to a second charge pump control signal being activated; and
   supplying the third charging current and the third discharging current in response to one or more of the first and second charge pump control signals being activated.

10. The method of claim 8, further comprising supplying an output voltage of the charge pump circuit on the common node.

11. The method of claim 8, wherein the first charging current, the second charging current and the third discharging current are equal to $(I_{CM}-\Delta I/2)/2$, and the first discharging current, the second discharging current, and the third charging current are equal to $(I_{CM}+\Delta I/2)/2$, wherein $I_{CM}$ is a common-mode current provided at the common node, and $\Delta I$ is a differential-mode current provided at the common node.

12. A method of operating a delta-sigma fractional-N frequency synthesizer comprising:
   providing an output signal having an output frequency in response to an output control voltage;
   dividing the output signal by a plurality of integers to create a divided frequency signal;
   providing a reference frequency signal;
   generating a first charge pump control signal and a second charge pump control signal that are representative of a phase difference between the divided frequency signal and the reference frequency signal; and generating the output control voltage in response to the first and second charge pump control signals by:

enabling a pair of matched charging current sources coupled to a common node when the first charge pump control signal is activated, enabling a pair of matched discharging current sources coupled to the common node when the second charge pump control signal is activated, and enabling an error canceling charging current source and an error canceling discharging current source, each coupled to the common node, when either the first charge pump control signal or the second charge pump control signal is activated.

13. The method of claim 12, wherein a current flowing through each of the pair of matched charging current sources is equal to a current flowing through the error canceling discharging current source when the first charge pump control signal is activated.

14. The method of claim 13, wherein a current flowing through each of the pair of matched discharging charging current sources is equal to a current flowing through the error canceling charging current source when the second charge pump control signal is activated.

* * * * *